United States Patent
Heo et al.

(10) Patent No.: US 12,489,374 B2
(45) Date of Patent: Dec. 2, 2025

(54) MODULAR INVERTER AND LARGE-CAPACITY INVERTER ASSEMBLIES INCLUDING THE MODULAR INVERTER

(71) Applicant: HYUNDAI MOBIS CO., LTD., Seoul (KR)

(72) Inventors: Min Heo, Seoul (KR); Eun Soo Jung, Goyang-si (KR); Yu Cheol Park, Anyang-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 223 days.

(21) Appl. No.: 18/500,371

(22) Filed: Nov. 2, 2023

(65) Prior Publication Data
US 2024/0313665 A1    Sep. 19, 2024

(30) Foreign Application Priority Data
Mar. 16, 2023 (KR) .................. 10-2023-0034645

(51) Int. Cl.
*H02M 7/00* (2006.01)
(52) U.S. Cl.
CPC .................. *H02M 7/003* (2013.01)
(58) Field of Classification Search
CPC . H01L 2224/48091; H01L 2224/48472; H01L 2224/73265; H01L 2224/48227; H01L 2224/49175; H01L 2224/48247; H01L 2224/48137; H01L 2224/32225; H01L 2924/3011; H01L 2924/00012; H01L 2924/1305; H01L 2924/0002; H01L 2924/19107; H01L 2924/00014; H01L 2924/30107; H01L 2924/13091;
(Continued)

(56) References Cited

U.S. PATENT DOCUMENTS

| 9,907,215 B2 | 2/2018 | Backhaus et al. |
| 2012/0170217 A1 | 7/2012 | Nishikimi et al. |

(Continued)

FOREIGN PATENT DOCUMENTS

KR    10-2022-0160248 A    12/2022

OTHER PUBLICATIONS

European Office Action Issued on Jun. 13, 2025, in Counterpart European Patent Application No. 23 208 601.7 (36 Pages in English).

(Continued)

*Primary Examiner* — Bryan R Perez
(74) *Attorney, Agent, or Firm* — NSIP Law

(57) ABSTRACT

A modular inverter including a capacitor unit including two or more capacitors arranged at a first side, a first capacitor busbar contacting a lower end of the capacitor unit and including a first capacitor connection portion including a first portion located on a second side of an upper end of the capacitor unit, a second capacitor busbar covering the upper end of the capacitor unit and including a second capacitor connection portion including a second portion extending outwardly to a third side of the upper end of the capacitor unit, a cooling unit disposed above the second capacitor busbar, and one or more power modules disposed above the cooling unit, the one or more power modules including a first power module busbar and a second power module busbar extending to the third side of the upper end of the capacitor unit and connected to the second capacitor connection portion.

15 Claims, 12 Drawing Sheets

(58) Field of Classification Search
CPC ...... H01L 2924/13055; H01L 2924/00; H02M 7/00–003
See application file for complete search history.

(56) References Cited

U.S. PATENT DOCUMENTS

| | | |
|---|---|---|
| 2018/0152114 A1 | 5/2018 | Chun et al. |
| 2019/0260302 A1 | 8/2019 | Liu et al. |
| 2022/0337167 A1 | 10/2022 | Mizuno et al. |

OTHER PUBLICATIONS

Extended European search report issued on Sep. 5, 2024, in counterpart European Patent Application No. 23208601.7 (14 pages).

MODULAR INVERTER AND LARGE-CAPACITY INVERTER ASSEMBLIES INCLUDING THE MODULAR INVERTER

CROSS-REFERENCE TO RELATED APPLICATIONS

This application claims priority under 35 U.S.C. § 119 to Korean Patent Application No. 10-2023-0034645, filed on Mar. 16, 2023, in the Korean Intellectual Property Office, the entire disclosure of which is incorporated herein by reference for all purposes.

BACKGROUND

1. Field

The following disclosure relates to a modular inverter and a large-capacity inverter assembly including the modular inverter, and in particular, to a modular inverter that may be applied to motors of various power ranges using a single inverter, maximize a cooling effect by changing a structure, and reduce inductance and a large-capacity inverter assembly including the modular inverter.

2. Description of the Related Art

In general, an inverter includes a housing including a power module, a DC link capacitor, a current sensor, a filter, and a cooler, and various boards. Among them, the power module is configured in the form of a single pack or three power modules are arranged in series for each phase. A lower end of the power module is configured as an integrated heat sink or is in surface-contact with and cooled by a heat sink configured integrally with the housing and is disposed to face the DC link capacitor. The filter constitutes an inductor, capacitor, etc. using a bridge-type busbar connected from a battery input to the DC link capacitor.

As described above, the inverter of the related art responds to a certain level of motor power according to capacity of the power module, and in order to respond to a medium or high power inverter, it is necessary to newly develop components, such as capacitors, from the power module and it is also required to rearrange each component according to component capacity and develop new products in an inverter unit, and thus, it may be difficult to respond flexibly according to motor power.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, here is provided a modular inverter including a capacitor unit including two or more capacitors arranged at a first side, a first capacitor busbar contacting a lower end of the capacitor unit and including a first capacitor connection portion including a first portion located on a second side of an upper end of the capacitor unit, a second capacitor busbar covering the upper end of the capacitor unit and including a second capacitor connection portion including a second portion extending outwardly to a third side of the upper end of the capacitor unit, a cooling unit disposed above the second capacitor busbar, and one or more power modules disposed above the cooling unit, wherein each of the one or more power modules includes a first power module busbar extending to the second side of the upper end of the capacitor unit and connected to the first capacitor connection portion and a second power module busbar extending to the third side of the upper end of the capacitor unit and connected to the second capacitor connection portion.

The first capacitor busbar may include a first part in contact with the lower end of the capacitor unit and a second part configured to be upwardly bent from one end of the first part and including an upper end in contact with the second capacitor connection portion.

The modular inverter may include a case configured to accommodate the first portion of the first capacitor busbar, the second portion of the second capacitor busbar, and the capacitor unit and including a hole therein through which the first capacitor connection portion and the second capacitor connection portion are exposed to an outside.

The second capacitor busbar includes a protrusion formed by bending a portion thereof upward and configured to be in contact with the upper end of the capacitor unit.

In a general aspect, here is provided a large-capacity inverter assembly including a first modular inverter and a second modular inverter, each respective first capacitor connection portion and each respective second capacitor connection portion of the first modular inverter and the second modular inverter are disposed to face each other, a first bus plate having a plate-like shape and disposed between the first modular inverter and the second modular inverter and connecting the first capacitor connection portions respectively included in the first modular inverter and the second modular inverter, and a second bus plate disposed above the first bus plate to be spaced apart from the first bus plate and connecting the second capacitor connection portions respectively included in the first modular inverter and the second modular inverter.

The second bus plate may be formed to cover an upper portion of one or more power modules included in one of the first modular inverter and the second modular inverter.

The second bus plate may include a hole therein formed in a portion in which the one or more power modules and the one of the first modular inverter and the second modular inverter are electrically connected to each other.

The first capacitor connection portion and the second capacitor connection portion are bent upwardly, first ends of a first power module busbar and second ends of a second power module busbar respectively included in one or more power modules of the first modular inverter and the second modular inverter are bent upwardly, the first capacitor connection portion is configured to be connected in surface-contact with the first power module busbar, the second capacitor connection portion is configured to be connected in surface-contact with the second power module busbar, the first bus plate includes a first welded portion configured to be bent to be in surface-contact with the first capacitor connection portion, and the second bus plate includes a second welded portion configured to be bent to be in surface-contact with the second capacitor connection portion.

The first capacitor connection portion includes a 1-1 capacitor connection portion configured to be in surface-contact with the first power module busbar and a 1-2 capacitor connection portion configured to be spaced apart from the 1-1 capacitor connection portion and connected to be in surface-contact with the first welded portion.

The 1-1 capacitor connection portion and the 1-2 capacitor connection portion are located at a first end of the first bus plate and are spaced apart from each other in a first direction in which the first end of the first bus plate extends and in a second direction in which the first modular inverter and the second modular inverter are respectively arranged.

The second capacitor connection portion may include a 2-1 capacitor connection portion configured to be in surface-contact with the second power module busbar and a 2-2 capacitor connection portion configured to be spaced apart from the 2-1 capacitor connection portion and connected to be in surface-contact with the second welded portion.

The 2-1 capacitor connection portion and the 2-2 capacitor connection portion located at a second end of the second bus plate and are spaced apart from each other in a third direction in which the second end of the second bus plate extends and in a fourth direction in which the first modular inverter and the second modular inverter are respectively arranged.

The first bus plate may be screwed to the two first capacitor busbars, and the second bus plate may be screwed to the two second capacitor busbars.

The first bus plate may be welded to the two first capacitor busbars, and the second bus plate may be welded to the two second capacitor busbars.

In a general aspect, here is provided a method for manufacturing a large-capacity inverter assembly including disposing a first jig between a 1-1 capacitor connection portion and a 1-2 capacitor connection portion based on a direction in which a first modular inverter and a second modular inverter are spaced apart from each other, disposing a second jig so that the 1-1 capacitor connection portion is located between the second jig and the first jig, disposing a third jig so that the 1-2 capacitor connection portion is located between the third jig and the first jig, welding the 1-1 capacitor connection portion and a first power module busbar as a first welded portion, and welding the 1-2 capacitor connection portion and the first welded portion, while pressing the second jig and the third jig toward the first jig.

In a general aspect, here is provided a method for manufacturing a large-capacity inverter assembly including disposing a first jig between a 2-1 capacitor connection portion and a 2-2 capacitor connection portion based on a direction in which a first modular inverter and a second modular inverter are spaced apart from each other, disposing a second jig so that the 2-1 capacitor connection portion is located between the second jig and the first jig, disposing a third jig so that the 2-2 capacitor connection portion is located between the third jig and the first jig, welding the 2-1 capacitor connection portion and a second power module busbar as a second welded portion, and welding the 2-2 capacitor connection portion and the second welded portion, while pressing the second jig and the third jig toward the first jig.

Each of the first modular inverter and the second modular inverter may include a capacitor unit including two or more capacitors arranged at a first side, a first capacitor busbar configured to contact a lower end of the capacitor unit and including a first capacitor connection portion including a first portion located on a second side of an upper end of the capacitor unit, a second capacitor busbar configured to cover the upper end of the capacitor unit and including a second capacitor connection portion including a second portion extending outwardly to be located on a third side of the upper end of the capacitor unit, a cooling unit disposed above the second capacitor busbar, and one or more power modules disposed above the cooling unit, the one or more power modules each may include a first power module busbar extending to the second side of the upper end of the capacitor unit and connected to the first capacitor connection portion and a second power module busbar extending to the third side of the upper end of the capacitor unit and connected to the second capacitor connection portion.

Each of the first modular inverter and the second modular inverter may include a capacitor unit including two or more capacitors arranged at a first side, a first capacitor busbar configured to contact a lower end of the capacitor unit and including a first capacitor connection portion including a first portion located on a second side of an upper end of the capacitor unit, a second capacitor busbar configured to cover the upper end of the capacitor unit and including a second capacitor connection portion including a second portion extending outwardly to be located on a third side of the upper end of the capacitor unit, a cooling unit disposed above the second capacitor busbar, and one or more power modules disposed above the cooling unit, the one or more power modules each includes the first power module busbar extending to the second side of the upper end of the capacitor unit and connected to the first capacitor connection portion, and a second power module busbar extending to the third side of the upper end of the capacitor unit and connected to the second capacitor connection portion.

Each respective first capacitor connection portion and each respective second capacitor connection portion of the first modular inverter and the second modular inverter are disposed to face each other, the large-capacity inverter assembly further may include a first bus plate having a plate-like shape and disposed between the first modular inverter and the second modular inverter and connecting a first capacitor connection portions respectively included in the first modular inverter and the second modular inverter and a second bus plate disposed above the first bus plate to be spaced apart from the first bus plate and connecting a second capacitor connection portions respectively included in the first modular inverter and the second modular inverter, the first capacitor connection portion and the second capacitor connection portion are bent upwardly, first ends of a first power module busbar and second ends of a second power module busbar respectively included in one or more power modules of the first modular inverter and the second modular inverter are bent upwardly, the first capacitor connection portion is configured to be connected in surface-contact with the first power module busbar, the second capacitor connection portion is configured to be connected in surface-contact with the second power module busbar, the first bus plate includes a first welded portion configured to be bent to be in surface-contact with the first capacitor connection portion, and the second bus plate includes a second welded portion configured to be bent to be in surface-contact with the second capacitor connection portion, the first capacitor connection portion including the 1-1 capacitor connection portion configured to be in surface-contact with the first power module busbar and the 1-2 capacitor connection portion configured to be spaced apart from the 1-1 capacitor connection portion and connected to be in surface-contact with the first welded portion.

Each of the first modular inverter and the second modular inverter may include a capacitor unit including two or more capacitors arranged at a first side, a first capacitor busbar configured to contact a lower end of the capacitor unit and including a first capacitor connection portion including a first portion located on a second side of an upper end of the capacitor unit, a second capacitor busbar configured to cover the upper end of the capacitor unit and including a second capacitor connection portion including a second portion extending outwardly to be located on a third side of the upper end of the capacitor unit, a cooling unit disposed above the second capacitor busbar, and one or more power modules disposed above the cooling unit, the one or more power modules each may include a first power module busbar extending to the second side of the upper end of the capacitor unit and connected to the first capacitor connection portion and the second power module busbar extending to the third side of the upper end of the capacitor unit and connected to the second capacitor connection portion.

Figure 1:
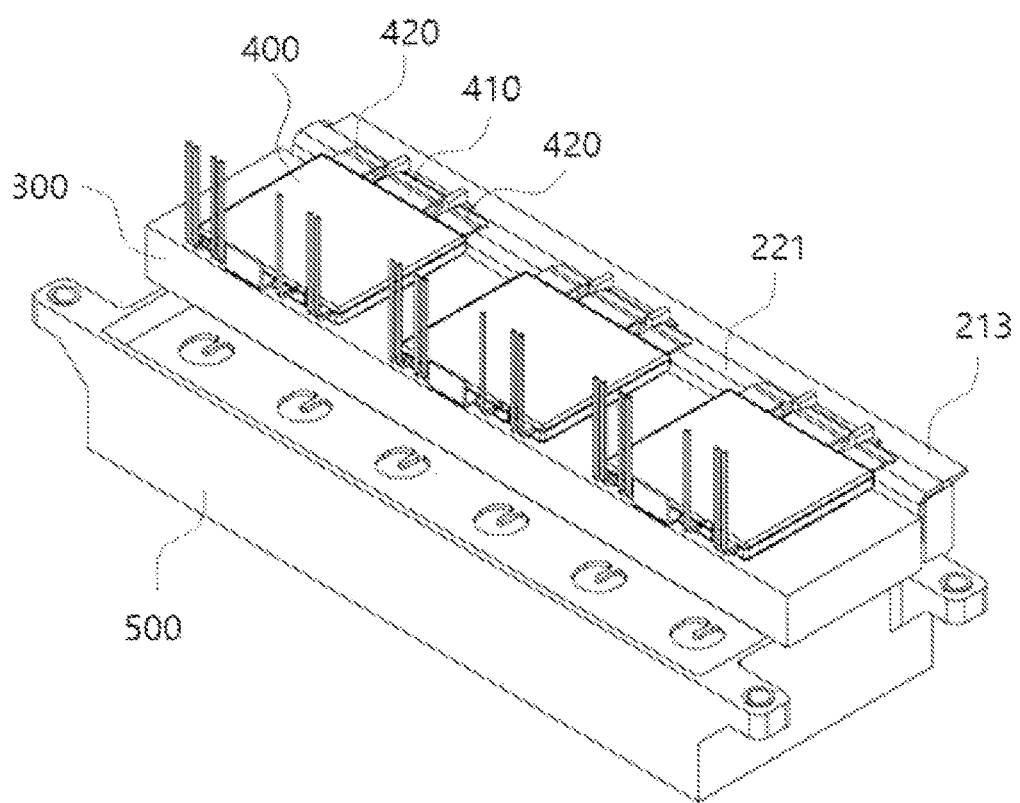
FIGS. 1 and 2 are combined perspective views of a modular inverter according to a first exemplary embodiment of the present invention viewed from different angles.

Throughout the drawings and the detailed description, unless otherwise described or provided, the same, or like, drawing reference numerals may be understood to refer to the same, or like, elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Advantages and features of the present disclosure and methods of achieving the advantages and features will be clear with reference to embodiments described in detail below together with the accompanying drawings. However, the present disclosure is not limited to the embodiments disclosed herein but will be implemented in various forms. The embodiments of the present disclosure are provided so that the present disclosure is completely disclosed, and a person with ordinary skill in the art can fully understand the scope of the present disclosure. The present disclosure will be defined only by the scope of the appended claims. Meanwhile, the terms used in the present specification are for explaining the embodiments, not for limiting the present disclosure.

Terms, such as first, second, A, B, (a), (b) or the like, may be used herein to describe components. Each of these terminologies is not used to define an essence, order or sequence of a corresponding component but used merely to distinguish the corresponding component from other component (s). For example, a first component may be referred to as a second component, and similarly the second component may also be referred to as the first component.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

In a description of the embodiment, in a case in which any one element is described as being formed on or under another element, such a description includes both a case in which the two elements are formed in direct contact with each other and a case in which the two elements are in indirect contact with each other with one or more other elements interposed between the two elements. In addition, when one element is described as being formed on or under another element, such a description may include a case in which the one element is formed at an upper side or a lower side with respect to another element.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof. [Modular inverter—First Exemplary Embodiment]

Figure 2:
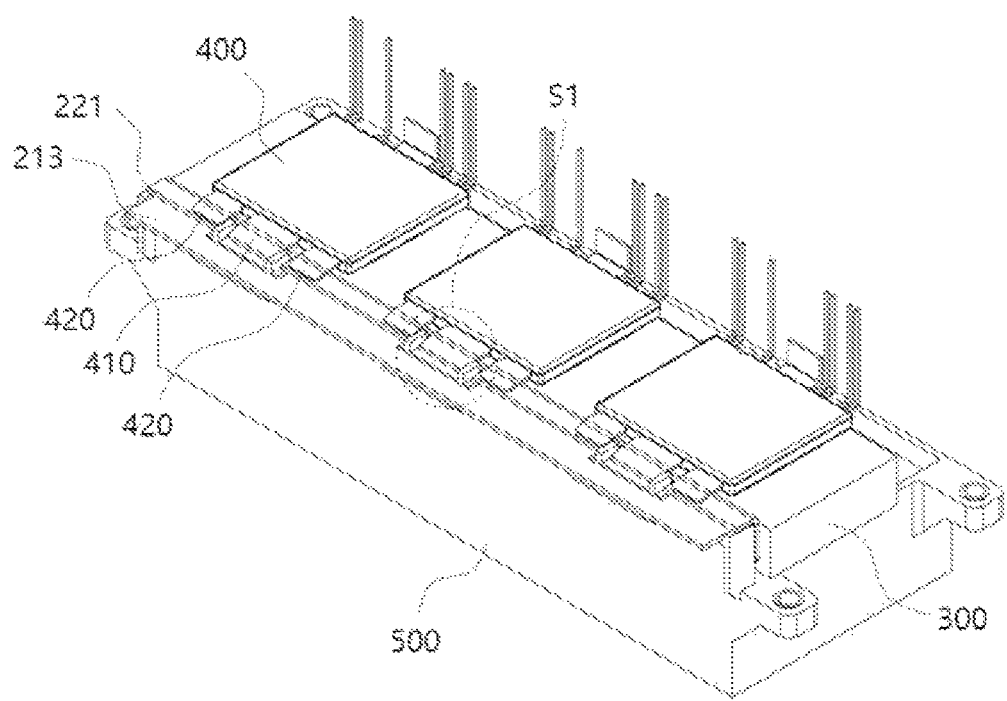
Figure 3:
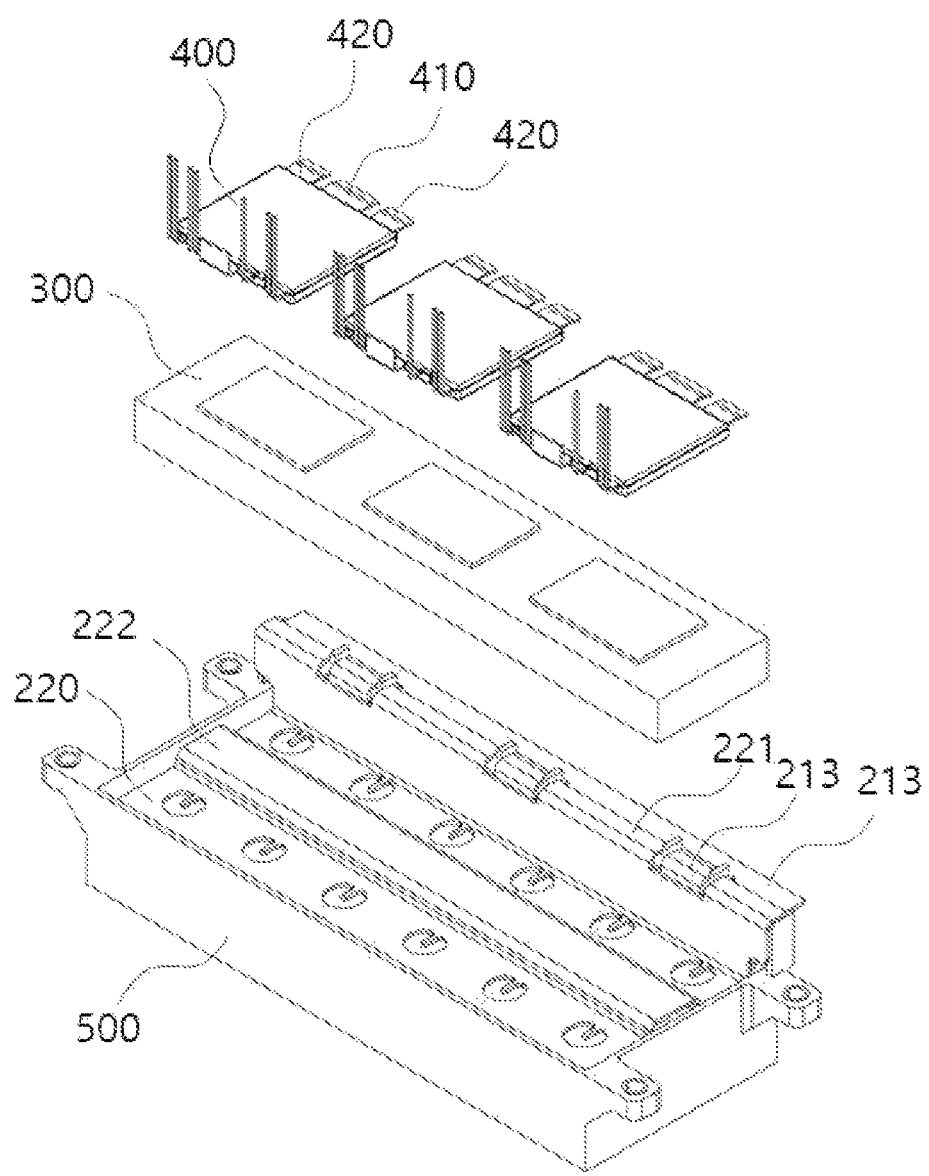
FIG. 3 is an exploded perspective view of a modular inverter according to a first exemplary embodiment of the present invention.
Figure 4:
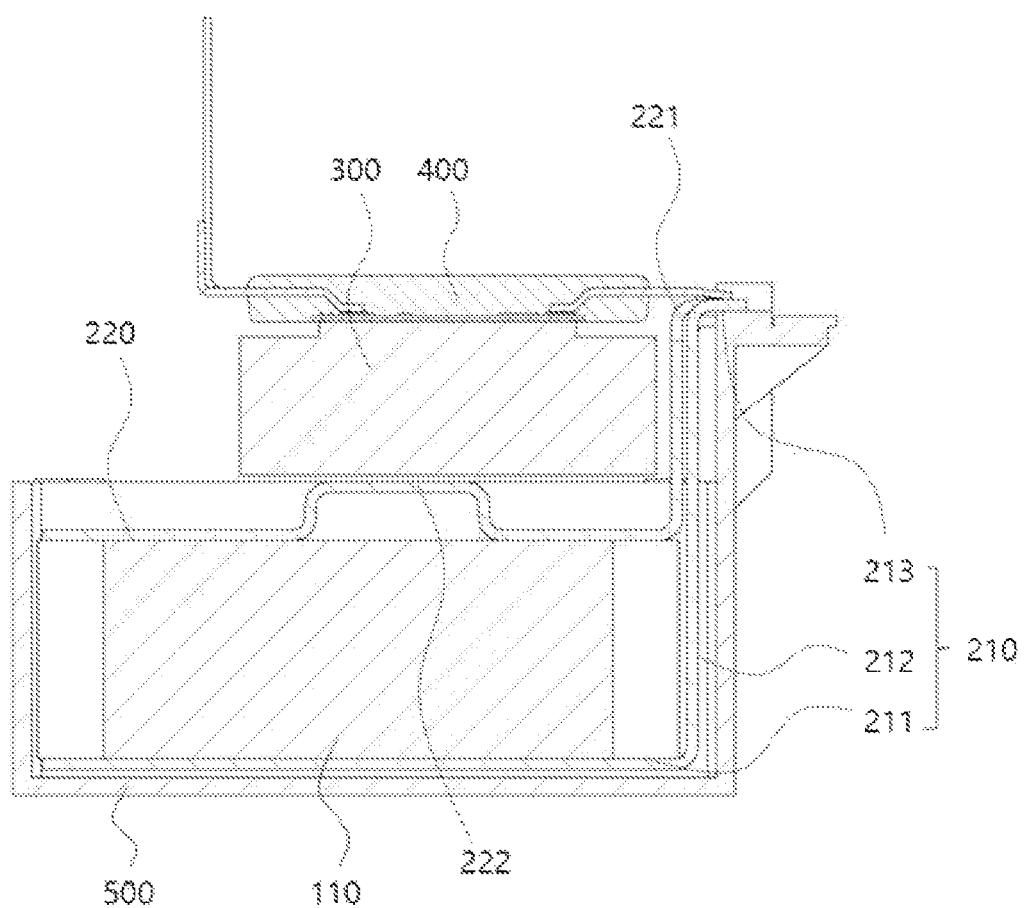
FIG. 4 is a cross-sectional view of a modular inverter according to the first exemplary embodiment of the present invention.

FIGS. 1 and 2 are combined perspective views of a modular inverter according to a first exemplary embodiment of the present invention viewed from different angles, FIG. 3 is an exploded perspective view of the modular inverter according to the first exemplary embodiment of the present invention, and FIG. 4 is a cross-sectional view of the modular inverter according to the first exemplary embodiment of the present invention.

As illustrated in FIGS. 1 to 4, the modular inverter according to the first exemplary embodiment of the present invention includes a capacitor unit, a first capacitor busbar 210, a second capacitor busbar 220, a cooling unit 300, and a power module 400.

The capacitor unit includes at least two or more capacitors 110 arranged on one side. The capacitor 110 included in the capacitor unit may be a film capacitor. The film capacitor is a capacitor in which a film dielectric, such as polypropylene, polystyrene, or Teflon is placed between electrodes, such as aluminum or copper, and wound into a roll. Since the single capacitor 110 is wound into a roll, a shape thereof includes a curved surface. The capacitor unit may include a positive electrode terminal and a negative electrode terminal. In the present exemplary embodiment, the negative electrode terminal is formed in an upper portion of the capacitor unit and the positive electrode terminal is formed in a lower portion thereof. However, the present invention does not limit the directions of the negative electrode terminal and the positive electrode terminal of the capacitor unit, and the directions of the negative electrode terminal and the positive electrode terminal may be interchanged. In addition, in the present exemplary embodiment, the capacitor unit is disposed so that the negative electrode terminal and the positive electrode terminal are formed in the upper and lower portions thereof, respectively, but the first capacitor busbar 210 may be formed to be connected to a lower end of the capacitor unit, that is, the positive electrode terminal, and the second capacitor busbar 220 may be formed to be connected to an upper end of the capacitor unit, that is, the negative electrode terminal.

A portion of each of the first capacitor busbar 210 and the second capacitor busbar 220 may extend outwardly and be located at one side of the upper end of the capacitor unit. The portion extending outwardly from the first capacitor busbar 210 and located at one side of the upper end of the capacitor unit is a portion connected to a power module 400 to be described below, and is referred to as a first capacitor connection portion 213, and a portion extending outwardly from the second capacitor busbar 220 and located at one side of the upper end of the capacitor unit is also a portion connected to the power module 400 and is referred to as the second capacitor connection portion 221. The first capacitor connection portion 213 and the second capacitor connection portion 221 are connected to the power module busbar included in the power module 400.

The first capacitor busbar 210 is connected to the first power module busbar 410 included in the power module 400, and the second capacitor busbar 220 is connected to the second power module busbar 420 included in the power module 400. The first power module busbar 410 may be a positive electrode terminal, and the second power module busbar 420 may be a negative electrode terminal.

In the present exemplary embodiment, each power module 400 may include one first power module busbar 410 and two second power module busbars 420. The single first power module busbar 410 may be located in the middle, and the second power module busbar 420 may be disposed on both sides of the first power module busbar 410, respectively. The first capacitor connection portion 213 may be located below the second capacitor connection portion 221, but a portion of the first capacitor connection portion 213 may protrude through a hole formed in the second capacitor connection portion 221. The hole formed in the second capacitor connection portion 221 is a portion overlapping the first power module busbar 410, and the first capacitor connection portion 213 protruding through the hole and the first power module busbar 410 may be welded to be connected to each other. Based on FIG. 1, a hole is formed in the second capacitor connection portion 221, and a portion of the first capacitor connection portion 213 protruding through a penetrated portion is S1, and the first capacitor connection portion 213 and the first power module busbar 410 are interconnected through the corresponding portion S1.

The above capacitor unit, the first capacitor busbar 210, and the second capacitor busbar 220 are accommodated in the case 500. At this time, the case 500 accommodates only portions of the capacitor unit, the first capacitor busbar 210, and the second capacitor busbar 220, so that the first capacitor connection portion 213 and the second capacitor connection portion 221 may be exposed to the outside of the case 500.

The cooling unit 300 is disposed above the second capacitor busbar 220. The cooling unit 300 serves to cool the capacitor unit, the second capacitor busbar 220 and the power module 400. The cooling unit 300 may serve as a general heat sink, but in an exemplary embodiment, a separate heat exchanger may be installed in the cooling unit 300.

The power module 400 is disposed above the cooling unit 300. In the modular inverter according to the first exemplary embodiment of the present invention, three power modules 400 may be arranged above the cooling unit 300. Here, the three power modules 400 may be spaced apart from each other at regular intervals. The reason why three power modules 400 are arranged in the present exemplary embodiment is that the modular inverter according to the present exemplary embodiment is a three-phase inverter. That is, each of the three power modules 400 corresponds to a single phase.

In the modular inverter according to the first exemplary embodiment of the present invention, the first capacitor busbar 210 includes a first part 211, a second part 212, and the first capacitor connection portion 213 described above.

The first part 211 has a plate-like shape and is in contact with the lower end of the capacitor unit. A width of the first part 211 may be greater than a width of the lower end of the capacitor unit.

The second part 212 is a part bent upwardly from one end of the first part 211. The second part 212 may be bent vertically from one end of the first part 211. The second capacitor connection portion 221 may extend in a horizontal direction from an upper end of the second part 212.

Similarly, the second capacitor busbar 220 disposed to be in contact with the upper end of the capacitor unit may be bent into three parts including the second capacitor connection portion 221.

The case 500 accommodates the first part 211 and the second part 212 included in the first capacitor busbar 210 described above, and the first capacitor connection portion 213 and the second capacitor connection portion 221 are exposed to the outside from the hole formed in the case 500. The first capacitor connection portion 213 and the second capacitor connection portion 221 are spaced apart and insulated from each other, but are located at one side of the upper end of the capacitor unit. That is, at least portions of the first capacitor connection portion 213 and the second capacitor connection portion 221 overlap each other, but are spaced apart from each other and insulated from each other.

When the modular inverter according to the present exemplary embodiment is applied to a specific device (for example, a motor) through this structure, a welding process for connecting the corresponding device to the first capacitor connection portion 213 and the second capacitor connection portion 221 may be facilitated. A method of connecting the first capacitor connection portion 213 and the second capacitor connection portion 221 to other devices may include various methods other than welding.

The second capacitor busbar 220 of the modular inverter according to the first exemplary embodiment of the present invention includes a protrusion 222 formed as a portion in contact with the upper end of the capacitor unit is bent upwardly.

The protrusion 222 is a portion exposed upwardly from the second capacitor busbar 220, and an insertion hole is formed at the upper end of the case 500 so that the protrusion 222 is exposed to the outside. The protrusion 222 allows the cooling portion 300 and the second capacitor busbar 220 to be in direct contact with each other, thereby increasing cooling efficiency of the second capacitor busbar 220.

The first power module busbar 410 and the second power module busbar 420 included in the power module 400 are exposed to one side of the upper end of the capacitor unit. Each of the first power module busbar 410 and the second power module busbar 420 is exposed to the same position as the first capacitor busbar 210 and the second capacitor busbar 220, thereby facilitating an electrical connection between the first power module busbar 410 and the first capacitor connection portion 213 and an electrical connection between the second power module busbar 420 and the second capacitor connection portion 221. In addition, the modular inverter according to the first exemplary embodiment of the present invention has the structure as described above and may have reduced inductance compared to the related art, which is due to the first capacitor busbar 210 and the second capacitor busbar 220 overlapping the power module 400. More specifically, the modular inverter according to the first exemplary embodiment of the present invention has an effect of reducing inductance by about 36% compared to an inverter having a general structure.

[Large-Capacity Inverter Assembly—First Exemplary Embodiment]

Figure 5:
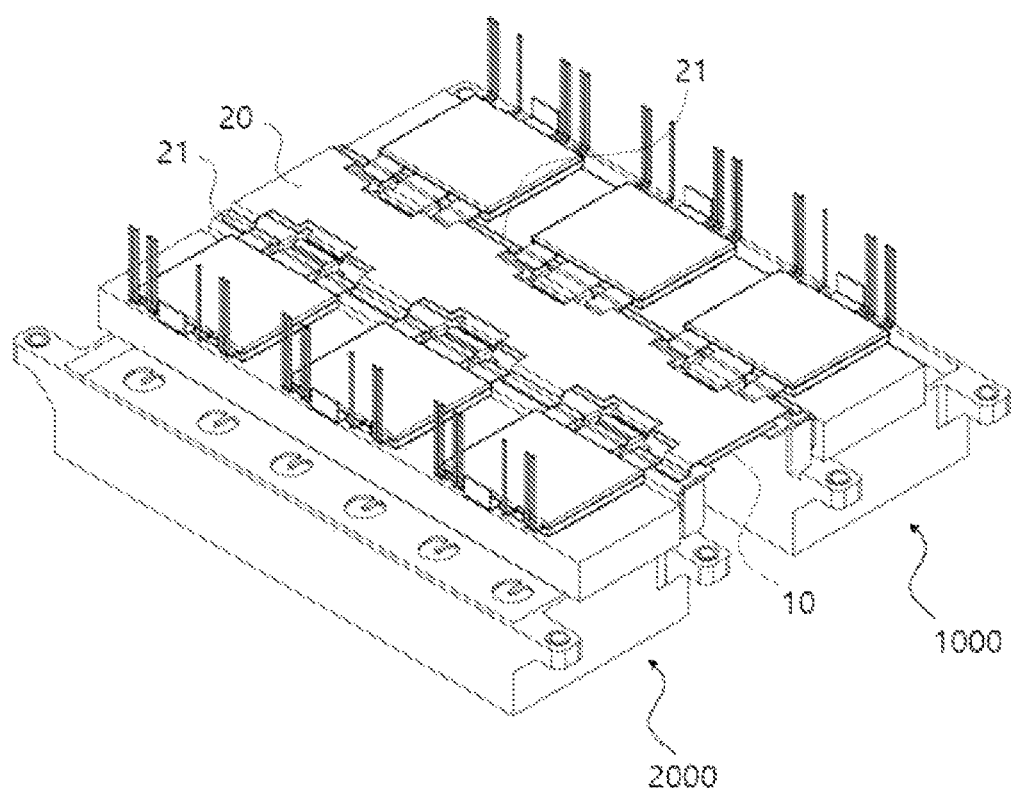
FIG. 5 is a perspective view of a large-capacity inverter assembly according to a first exemplary embodiment of the present invention.
Figure 6:
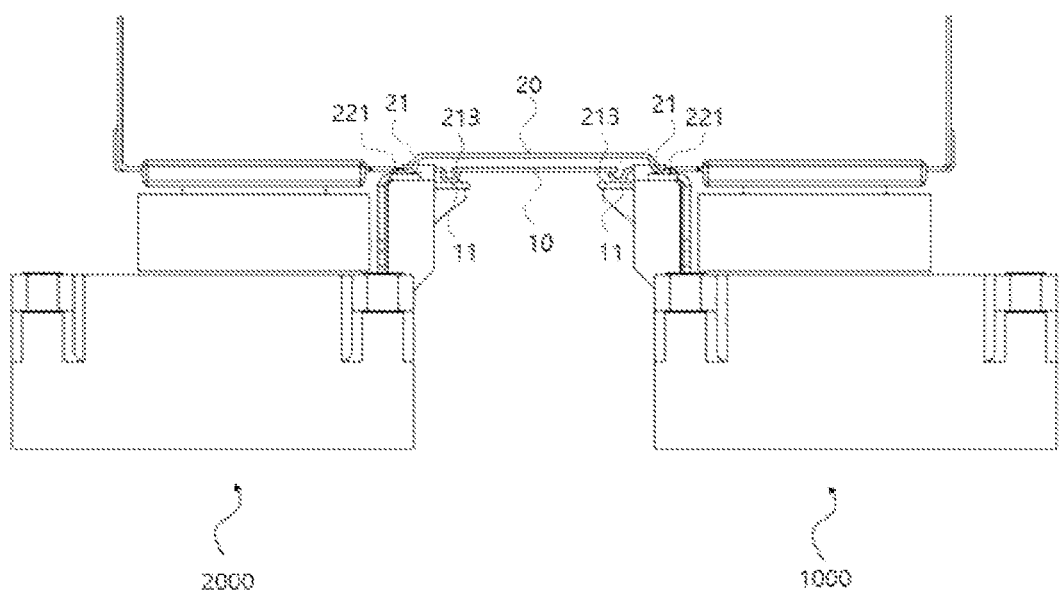
FIG. 6 is a front view of a large-capacity inverter assembly according to the first exemplary embodiment of the present invention.

FIG. 5 is a perspective view of a large-capacity inverter assembly according to the first exemplary embodiment of the present invention, and FIG. 6 is a front view of the large-capacity inverter assembly according to the first exemplary embodiment of the present invention.

As shown in FIGS. 5 and 6, the large-capacity inverter assembly according to the first exemplary embodiment of the present invention has a form in which two inverter modules according to the first exemplary embodiment of the present invention described above are connected to each other.

More specifically, as shown in FIGS. 5 and 6, the first modular inverter 1000 and the second modular inverter 2000 are disposed to face each other. At this time, the first capacitor connection portion 213 and the second capacitor connection portion 221 formed in the first modular inverter 1000 are arranged so that the first capacitor connection portion 213 and the second capacitor connection portion 221 formed in the second modular inverter 2000 are arranged to face each other.

Since the first modular inverter 1000 and the second modular inverter 2000 each include three power modules 400, the inverter module according to the first exemplary embodiment of the present invention may be used to drive a 6-phase motor or two three-phase motors.

The large-capacity inverter assembly according to the first exemplary embodiment of the present invention may further include a first bus plate 10 and a second bus plate 20.

The first bus plate 10 has a plate-like shape and serves to connect the first capacitor connection portion 213 of the first modular inverter 1000 and the first capacitor connection portion 213 of the second modular inverter 2000 to each other. The second bus plate 20 has a plate-like shape and serves to connect the second capacitor connection portion 221 of the first modular inverter 1000 and the second capacitor connection portion 221 of the second modular inverter 2000 to each other. The first bus plate 10 and the second bus plate 20 may be spaced apart from each other and insulated from each other. More specifically, the first bus plate 10 may be disposed on the lower side and the second bus plate 20 may be disposed on the upper side. However, the present invention does not limit the arrangement of the first bus plate 10 and the second bus plate 20 thereto, and the positions thereof may be changed.

A first welded portion 11, which is a portion connected to the first capacitor connection portion 213, is formed on the first bus plate 10. The first welded portion 11 is a portion protruding toward the first capacitor connection portion 213, relative to other portions. In the present exemplary embodiment, the single first welded portion 11 formed on the first bus plate 10 protrudes toward the single power module 400. A middle portion of the first welded portion 11 is bent downwardly and protrudes toward the first capacitor connection portion 213. A middle portion of the first capacitor connection portion 213 is bent downwardly and protrudes toward the first capacitor connection portion 213 side. The first capacitor connection portion 213 protrudes toward the first bus plate 10, relative to the second capacitor connection portion 221 located on the upper side. The bent portion of the first welded portion 11 is in contact with the first capacitor connection portion 213, and the contacted portion is welded, so that the first capacitor busbar 210 of the first modular inverter 1000 and the second capacitor busbar 220 of the second modular inverter 2000 is connected to each other. The first welded portion 11 of the present invention contact and is welded to the second capacitor busbar 220 using the protrusion, so that the presence or absence of contact may be identified more reliably than a method of welding in surface-contact and welding may be facilitated.

A second welded portion 21, which is a portion connected to the second capacitor connection portion 221, is formed on the second bus plate 20. The second welded portion 21 is a portion that protrudes toward the second capacitor connection portion 221, relative to other portions. TWO second welded portions 21 are disposed on both sides of the single power module 400. The area of the single second welded portion 21 disposed between the two power modules 400 may be larger than that of the second welded portion 21 disposed at the outermost portion. The second welded portion 21 may protrude from the second bus plate 20 toward the second capacitor connection portion 221 but may be bent downwardly to a certain extent so as to be in surface-contact with and welded to the second capacitor connection portion 221. While the second bus plate 20 is spaced apart from the first bus plate 10, whether the second welded portion 21 and the second capacitor connection portion 221 are in contact with each other may be determined more reliably and welding may be facilitated, like the protruding portion of the first welded portion 11.

In the large-capacity inverter assembly according to the first exemplary embodiment of the present invention, the first bus plate 10 and the second bus plate 20 overlap each other, additional inductance may be reduced through the structural arrangement of the first welded portion 11, the second welded portion 21, and the power module 400, and when such an arrangement as in the present exemplary embodiment is applied, there is an effect of reducing inductance by about 56% compared to the related art.

[Large-Capacity Inverter Assembly—Second Exemplary Embodiment]

Figure 7:
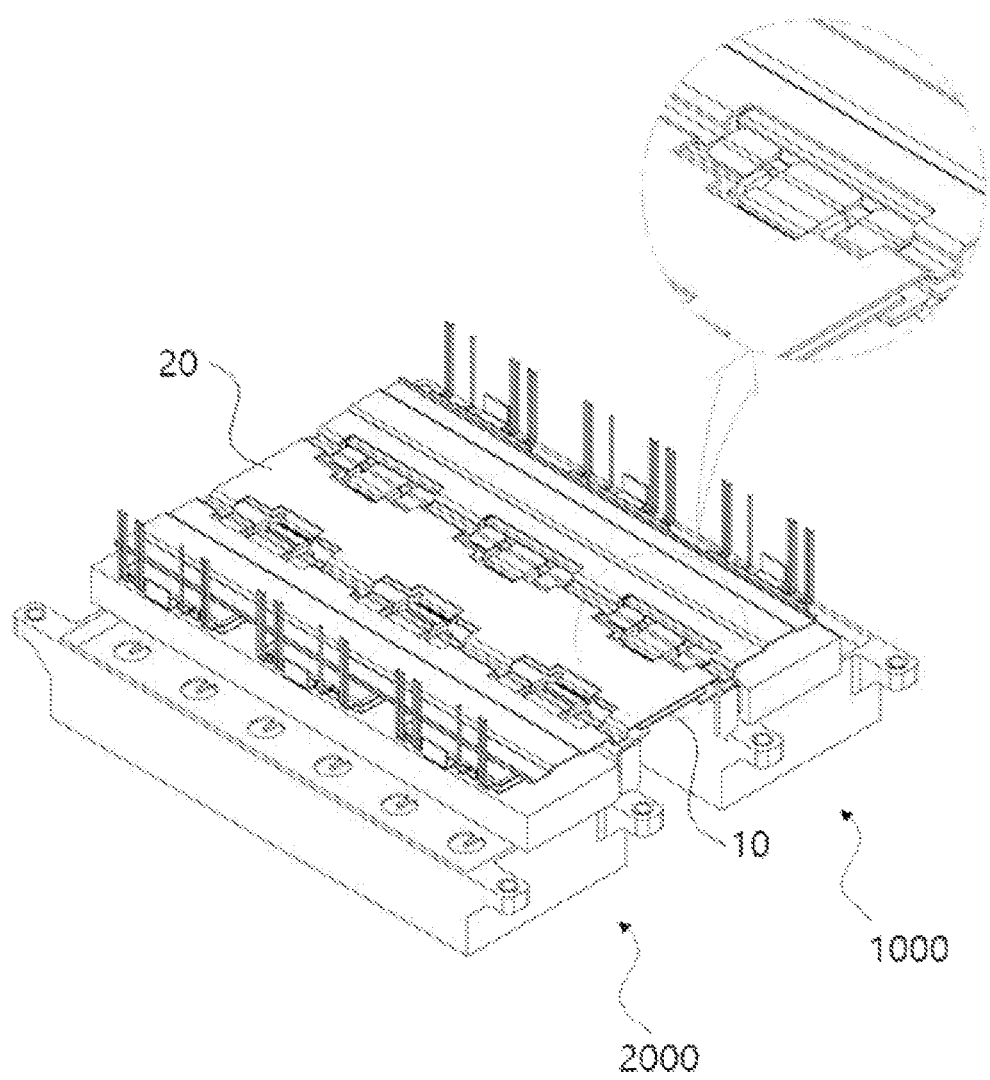
FIG. 7 is a perspective view of a large-capacity inverter assembly according to a second exemplary embodiment of the present invention.

FIG. 7 is a perspective view of a large-capacity inverter assembly according to a second exemplary embodiment of the present invention.

As shown in FIG. 7, in the large-capacity inverter assembly according to the second exemplary embodiment of the present invention, the second bus plate 20 located on the upper side in the large-capacity inverter assembly according to the first exemplary embodiment of the present invention described above extends to cover the upper portion of the power module 400.

Figure 8:
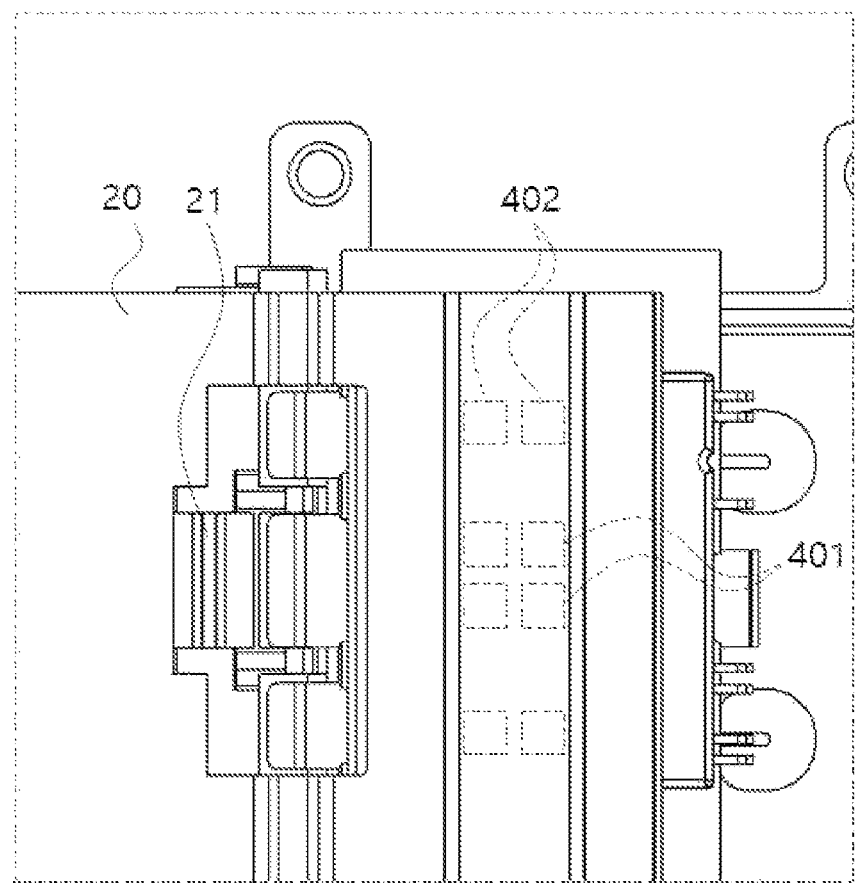
FIG. 8 is a partial top view of a large-capacity inverter assembly according to the second exemplary embodiment of the present invention.

FIG. 8 is a partial top view of a large-capacity inverter assembly according to a second exemplary embodiment of the present invention.

As shown in FIG. 8, the second bus plate 20 may be formed to cover upper portions of a positive electrode chip 401 and a negative electrode chip 402 included in the power module 400. A hole is formed in a portion in which the first bus plate 10 and the second bus plate 20 are connected to the first capacitor connection portion 213 and the second capacitor connection portion 221, respectively. This is because welding between the second welded portion 21 of the second bus plate 20 and the second capacitor connection portion 221 may be facilitated when the hole is formed in the corresponding portion.

In the large-capacity inverter assembly according to the second exemplary embodiment of the present invention, the second bus plate 20 is formed to cover an upper portion of the power module 400, so that inductance may be further reduced. More specifically, the large-capacity inverter assembly according to the second exemplary embodiment of the present invention may reduce inductance by about 11% compared to the large-capacity inverter assembly according to the first exemplary embodiment described above.

[Large-Capacity Inverter Assembly—Third Exemplary Embodiment, Manufacturing Method]

Figure 9:
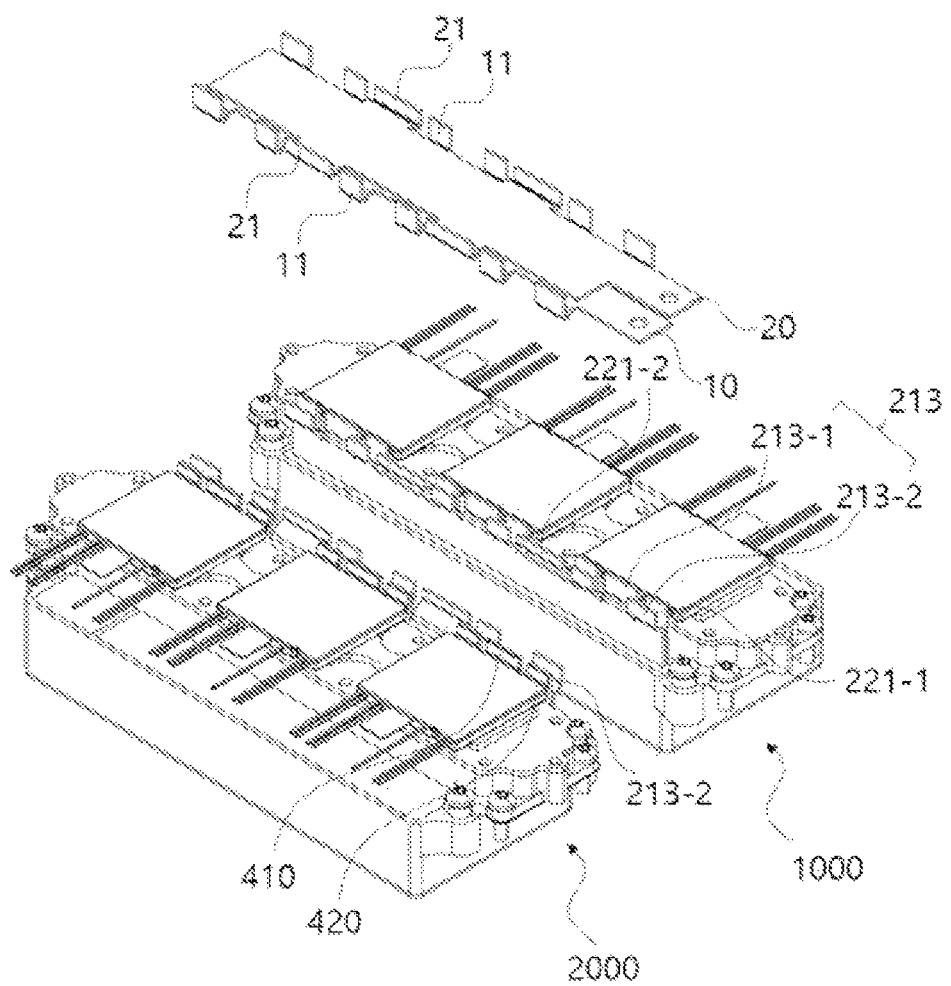
FIG. 9 is an exploded perspective view of a large-capacity inverter assembly according to a third exemplary embodiment of the present invention.
Figure 10:
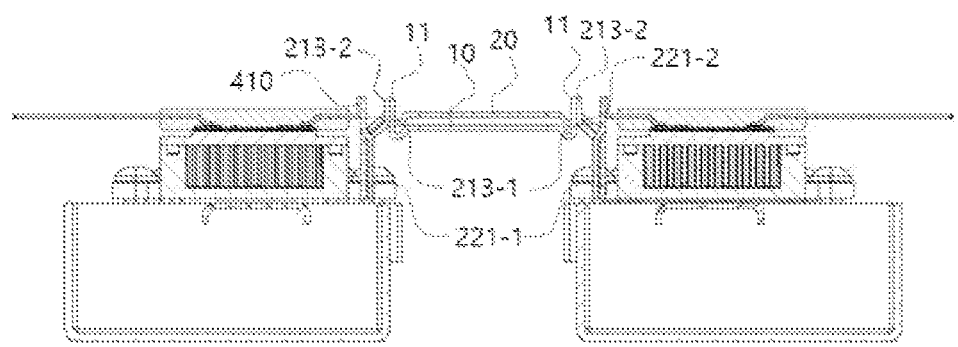
FIG. 10 is a cross-sectional view of a large-capacity inverter assembly according to the third exemplary embodiment of the present invention.

FIG. 9 is a perspective view of a large-capacity inverter assembly according to a third exemplary embodiment of the present invention, and FIG. 10 is a cross-sectional view of a large-capacity inverter assembly according to the third exemplary embodiment of the present invention.

As shown in FIGS. 9 and 10, the large-capacity inverter assembly according to the third exemplary embodiment of the present invention, the shapes of the first bus plate 10, the second bus plate 20, the first capacitor connection portion 213, the second capacitor connection portion 221, the first power module busbar 410, and the second power module busbar 420 in the large-capacity inverter assembly according to the first exemplary embodiment described above are changed.

More specifically, as shown in FIGS. 9 and 10, the first capacitor connection portion 213 includes a 1-1 capacitor connection portion 213-1 and a 1-2 capacitor connection portion 213-2.

The 1-1 capacitor connection portion 213-1 is formed to be bent upwardly, compared to the first capacitor connection portion 213 in the large-capacity inverter assembly according to the first exemplary embodiment of the present invention described above has a plate-like shape extending toward the modular inverter on the opposite side thereof.

The 1-2 capacitor connection portion 213-2 is also formed to be bent upwardly. Here, the 1-2 capacitor connection portion 213-2 is formed to be spaced apart from the 1-1 capacitor connection portion 213-1 but is bent toward the modular inverter on the opposite side, relative to the 1-1 capacitor connection portion 213-1. Therefore, when the large-capacity inverter assembly according to the third exemplary embodiment of the present invention shown in FIG. 9 is viewed from the right lower side, a space is formed between the 1-1 capacitor connection portion 213-1 and the 1-2 capacitor connection portion 213-2.

The second capacitor connection portion 221 includes a 2-1 capacitor connection portion 221-1 and a 2-2 capacitor connection portion 221-2.

The 2-1 capacitor connection portion 221-1 is connected to be in surface-contact with the second power module busbar 420.

The 2-2 capacitor connection portion 221-2 is spaced apart in a direction in which the first bus plate 10 or the second bus plate 20 extends (a direction in which the power modules 400 are arranged in the single modular inverter) and is connected to be in surface-contact with the second welded portion 21. The 2-2 capacitor connection portion 221-2 protrudes toward the modular inverter on the opposite side, relative to the 2-1 capacitor connection portion 221-1. That is, when considering only the direction in which the two modular inverters are disposed, the 2-1 capacitor connection portion 221-1 is close to the power module 400 and the 2-2 capacitor connection portion 221-2 is close to the second welded portion 21 of the second bus plate 20.

In the large-capacity inverter assembly according to the third exemplary embodiment of the present invention shown in FIGS. 9 and 10, the structure in which the first bus plate 10 and the second bus plate 20 are welded is referred to as fillet welding. The portions (welded portions) connected to each other are bent upwardly and connected.

Among the above 1-1 capacitor connection portion 213-1, 1-2 capacitor connection portion 213-2, 2-1 capacitor connection portion 221-1, and 2-2 capacitor connection portion 221-2, the 1-1 capacitor connection portion 213-1 and the 2-2 capacitor connection portion 221-2 are located on the same plane as each other, and the 1-2 capacitor connection portion 213-2 and the 2-1 capacitor connection portion 221-1 are located on the same plane as each other.

Figure 11:
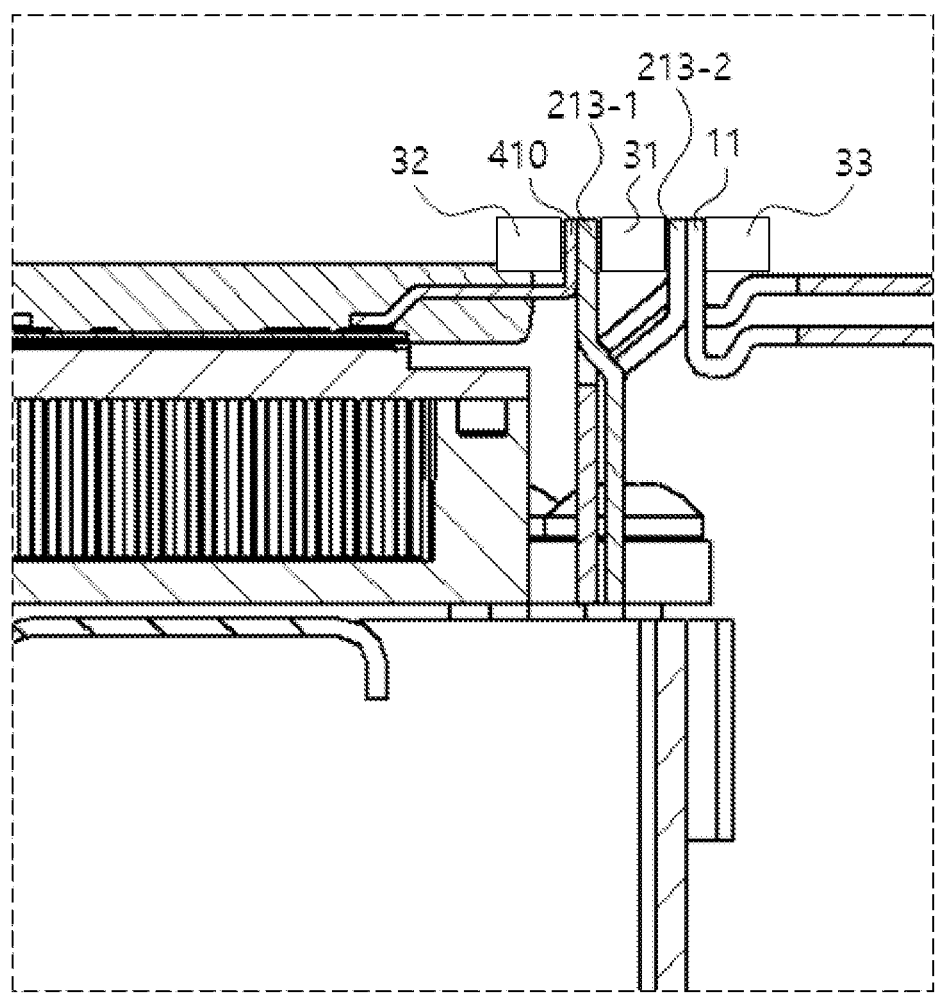
FIG. 11 is a partially enlarged view of FIG. 10 for explaining a portion of a method of manufacturing a large-capacity inverter assembly according to the first exemplary embodiment of the present invention.

FIG. 11 is a partially enlarged view of FIG. 10 for explaining a portion of a method of manufacturing a large-capacity inverter assembly according to the first exemplary embodiment of the present invention.

As shown in FIG. 11, a first jig 31 is disposed between the 1-1 capacitor connection portion 213-1 and the 1-2 capacitor connection portion 213-2, and a second jig 32 is disposed, and in this case, the second jig 32 is disposed so that the 1-1 capacitor connection portion 213-1 and the first power module busbar 410 are located between the first jig 31 and the second jig 32. Also, a third jig 33 is disposed so that the 1-2 capacitor connection portion 213-2 and the first welded portion 11 are located between the third jig 33 and the first jig 31. Thereafter, while the second jig 32 and the third jig 33 are pressed toward the first jig 31, the 1-1 capacitor connection portion 213-1 and the first power module busbar 410 are welded and the 1-2 capacitor connection portion 213-2 and the first welded portion 11 are welded. The operation of arranging the jigs and the operation of performing pressing and welding are referred to as operation a) and operation b), respectively.

As described above, since the 1-1 capacitor connection portion 213-1 and the 2-2 capacitor connection portion 221-2 are located on the same plane and the 1-2 capacitor connection portion 213-2 and the 2-1 capacitor connection portion 221-1 are located on the same plane, the 1-1 capacitor connection portion 213-1 may be replaced with the 2-2 capacitor connection portion 221-2, the 1-2 capacitor connection portion 213-2 may be replaced with the 2-1 capacitor connection portion 221-1, the first welded portion may be replaced with the second welded portion 21, and the first power module busbar 410 may be replaced with the second power module busbar 420 in operation a) and operation b).

The large-capacity inverter assembly according to the present invention has an effect of preventing lifting of the welded portion through the above operations.

[Large-Capacity Inverter Assembly—Fourth Exemplary Embodiment]

Figure 12:
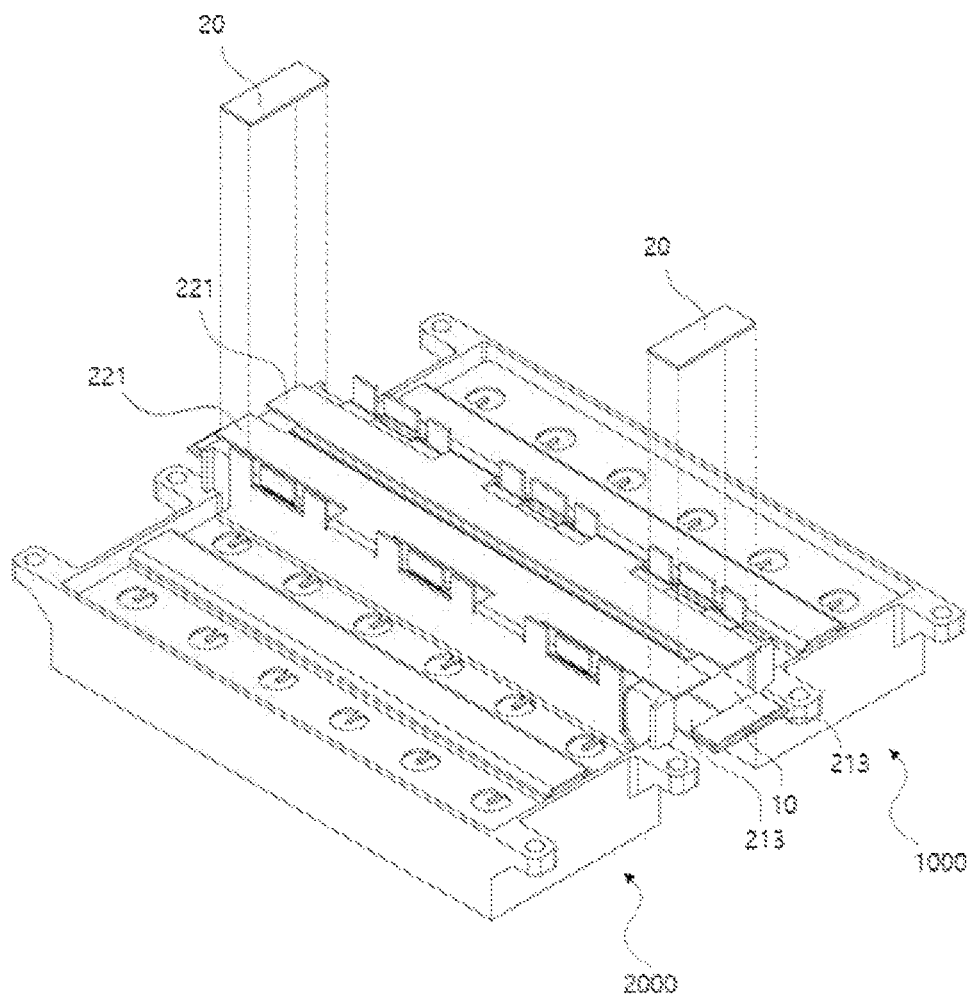
FIG. 12 is an exploded perspective view of a large-capacity inverter assembly according to a fourth exemplary embodiment of the present invention.

FIG. 12 is an exploded perspective view of a large-capacity inverter assembly according to a fourth exemplary embodiment of the present invention.

As shown in FIG. 12, in the large-capacity inverter assembly according to the fourth exemplary embodiment of the present invention, the first capacitor connection portion 213 in the large-capacity inverter assembly according to the first exemplary embodiment of the present invention described above extends toward another modular inverter, and the second capacitor connection portion 221 in the large-capacity inverter assembly according to the first exemplary embodiment of the present invention described above also extends toward another modular inverter.

The first bus plate 10 connects the first capacitor connection portions 213 that extend to each other, and here, the first bus plate 10 has a simple plate-like shape and connects the two first capacitor connection portions 213 to each other through welding or screwing.

The second bus plate 20 also connects the second capacitor connection portions 221 that extend to each other, and here, the second bus plate 20 has a simple plate-like shape and connects the two second capacitor connection portions 221 to each other through welding or screwing.

In the large-capacity inverter assembly according to the present exemplary embodiment, since most of the portions connected to each other are formed to be extended from the capacitor connection portions and the shape of the bus plate connecting the two capacitor connection portions to each other is simplified, the manufacturing and welding process are relatively easy.

According to the modular inverter and the large-capacity inverter assembly including the modular inverter according to the present invention as described above, in the modular inverter, since the power module busbar and the capacitor connection portion are exposed to the same position, there is an effect of facilitating a connection process, such as welding, when the modular inverter is applied to other devices.

In addition, according to the modular inverter according to the present invention, since the power module overlaps the capacitor unit, there is an effect of reducing inductance, compared to the related art inverter.

According to the large-capacity inverter assembly according to various exemplary embodiments as described above, since a large-capacity inverter may be implemented by connecting two modular inverters using the first bus plate and the second bus plate, there is no need to develop a separate inverter, so that economic feasibility may be secured in the inverter required for a large-capacity application.

In addition, according to the present invention, since the first bus plate and the second bus plate have an overlapping structure, there is an effect of reducing inductance compared to the large-capacity inverter of the related art.

In addition, according to the present invention, since the second bus plate has a structure covering the power module, there is an effect of further reducing inductance.

In addition, according to the present invention, since the hole is formed in the portion of the second bus plate in which the power module, the capacitor connection portion, and the welded portion are connected to each other, the operation of connecting the power module, the capacitor connection portion, and the welded portion itself is facilitated.

In addition, according to the present invention, since the bus plate is connected to the capacitor connection portion by fillet welding, there is an effect of improving a coupling force between the modular inverter and the bus plate.

In addition, according to the present invention, since the two capacitor connection portions in which the bus plate extends are connected to each other by welding or screwing, there is an effect of facilitating manufacturing and connection work of the inverter.

According to the method of manufacturing the large-capacity inverter assembly according to the present invention, since welding is performed, while pressing the welded portion using a jig, there is an effect of preventing lifting of the welded portion.

Various embodiments of the present disclosure do not list all available combinations but are for describing a representative aspect of the present disclosure, and descriptions of various embodiments may be applied independently or may be applied through a combination of two or more.

A number of embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A modular inverter, comprising:
   a capacitor unit comprising two or more capacitors arranged at a first side;

a first capacitor busbar contacting a lower end of the capacitor unit and comprising a first capacitor connection portion including a first portion located on a second side of an upper end of the capacitor unit;

a second capacitor busbar covering the upper end of the capacitor unit and comprising a second capacitor connection portion including a second portion extending outwardly to a third side of the upper end of the capacitor unit;

a cooling unit disposed above the second capacitor busbar; and one or more power modules disposed above the cooling unit, wherein each of the one or more power modules comprises:

a first power module busbar extending to the second side of the upper end of the capacitor unit and connected to the first capacitor connection portion; and a second power module busbar extending to the third side of the upper end of the capacitor unit and connected to the second capacitor connection portion.

2. The modular inverter of claim 1, wherein the first capacitor busbar further comprises:

a first part in contact with the lower end of the capacitor unit; and a second part configured to be upwardly bent from one end of the first part and including an upper end in contact with the second capacitor connection portion.

3. The modular inverter of claim 1, further comprising:

a case configured to accommodate the first portion of the first capacitor busbar, the second portion of the second capacitor busbar, and the capacitor unit and including a hole therein through which the first capacitor connection portion and the second capacitor connection portion are exposed to an outside.

4. The modular inverter of claim 3, wherein the second capacitor busbar includes a protrusion formed by bending a portion thereof upward and configured to be in contact with the upper end of the capacitor unit.

5. A large-capacity inverter assembly, comprising:

a first modular inverter and a second modular inverter, wherein each respective first capacitor connection portion and each respective second capacitor connection portion of the first modular inverter and the second modular inverter are disposed to face each other;

a first bus plate having a plate-like shape and disposed between the first modular inverter and the second modular inverter and connecting the first capacitor connection portions respectively included in the first modular inverter and the second modular inverter; and a second bus plate disposed above the first bus plate to be spaced apart from the first bus plate and connecting the second capacitor connection portions respectively included in the first modular inverter and the second modular inverter.

6. The large-capacity inverter assembly of claim 5, wherein the second bus plate is formed to cover an upper portion of one or more power modules included in one of the first modular inverter and the second modular inverter.

7. The large-capacity inverter assembly of claim 6, wherein the second bus plate includes a hole therein formed in a portion in which the one or more power modules and the one of the first modular inverter and the second modular inverter are electrically connected to each other.

8. The large-capacity inverter assembly of claim 5, wherein the first capacitor connection portion and the second capacitor connection portion are bent upwardly, wherein first ends of a first power module busbar and second ends of a second power module busbar respectively included in one or more power modules of the first modular inverter and the second modular inverter are bent upwardly, wherein the first capacitor connection portion is configured to be connected in surface-contact with the first power module busbar, wherein the second capacitor connection portion is configured to be connected in surface-contact with the second power module busbar, wherein the first bus plate includes a first welded portion configured to be bent to be in surface-contact with the first capacitor connection portion, and wherein the second bus plate includes a second welded portion configured to be bent to be in surface-contact with the second capacitor connection portion.

9. The large-capacity inverter assembly of claim 8, wherein the first capacitor connection portion comprises:

a 1-1 capacitor connection portion configured to be in surface-contact with the first power module busbar; and a 1-2 capacitor connection portion configured to be spaced apart from the 1-1 capacitor connection portion and connected to be in surface-contact with the first welded portion.

10. The large-capacity inverter assembly of claim 9, wherein the 1-1 capacitor connection portion and the 1-2 capacitor connection portion are located at a first end of the first bus plate and are spaced apart from each other in a first direction in which the first end of the first bus plate extends and in a second direction in which the first modular inverter and the second modular inverter are respectively arranged.

11. The large-capacity inverter assembly of claim 8, wherein the second capacitor connection portion includes:

a 2-1 capacitor connection portion configured to be in surface-contact with the second power module busbar; and a 2-2 capacitor connection portion configured to be spaced apart from the 2-1 capacitor connection portion and connected to be in surface-contact with the second welded portion.

12. The large-capacity inverter assembly of claim 11, wherein the 2-1 capacitor connection portion and the 2-2 capacitor connection portion located at a second end of the second bus plate and are spaced apart from each other in a third direction in which the second end of the second bus plate extends and in a fourth direction in which the first modular inverter and the second modular inverter are respectively arranged.

13. The large-capacity inverter assembly of claim 5, wherein the first bus plate is screwed to the two first capacitor busbars, and the second bus plate is screwed to the two second capacitor busbars.

14. The large-capacity inverter assembly of claim 5, wherein the first bus plate is welded to the two first capacitor busbars, and the second bus plate is welded to the two second capacitor busbars.

15. The large-capacity inverter assembly of claim 5, wherein each of the first modular inverter and the second modular inverter comprises:

a capacitor unit comprising two or more capacitors arranged at a first side;

a first capacitor busbar configured to contact a lower end of the capacitor unit and comprising a first capacitor connection portion including a first portion located on a second side of an upper end of the capacitor unit;

a second capacitor busbar configured to cover the upper end of the capacitor unit and comprising a second capacitor connection portion including a second portion extending outwardly to be located on a third side of the upper end of the capacitor unit;

a cooling unit disposed above the second capacitor busbar; and one or more power modules disposed above the cooling unit, wherein the one or more power modules each comprise:

a first power module busbar extending to the second side of the upper end of the capacitor unit and connected to the first capacitor connection portion; and a second power module busbar extending to the third side of the upper end of the capacitor unit and connected to the second capacitor connection portion.

* * * * *